United States Patent
He et al.

(10) Patent No.: US 9,324,830 B2
(45) Date of Patent: Apr. 26, 2016

(54) SELF-ALIGNED CONTACT PROCESS ENABLED BY LOW TEMPERATURE

(71) Applicant: International Business Machines Corporation, Armonk, NY (US)

(72) Inventors: Hong He, Schenectady, NY (US); Chiahsun Tseng, Wynantskill, NY (US); Chun-chen Yeh, Clifton Park, NY (US); Yunpeng Yin, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/227,345

(22) Filed: Mar. 27, 2014

(65) Prior Publication Data

US 2015/0279996 A1    Oct. 1, 2015

(51) Int. Cl.
| | |
|---|---|
| *H01L 29/66* | (2006.01) |
| *H01L 29/78* | (2006.01) |
| *H01L 21/283* | (2006.01) |
| *H01L 29/165* | (2006.01) |

(52) U.S. Cl.
CPC ........ *H01L 29/66545* (2013.01); *H01L 21/283* (2013.01); *H01L 29/665* (2013.01); *H01L 29/66628* (2013.01); *H01L 29/66636* (2013.01); *H01L 29/66795* (2013.01); *H01L 29/7848* (2013.01); *H01L 29/7851* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 3,596,347 A * | 8/1971 | Beale | H01L 29/0847 148/DIG. 106 |
| 5,413,961 A * | 5/1995 | Kim | 438/639 |
| 6,265,296 B1 | 7/2001 | Yen et al. | |
| 6,323,540 B1 | 11/2001 | Doan et al. | |
| 6,953,959 B2 | 10/2005 | Yang et al. | |
| 6,977,134 B2 | 12/2005 | Hao et al. | |
| 7,429,527 B2 | 9/2008 | Wang et al. | |
| 8,232,607 B2 | 7/2012 | Edge et al. | |
| 8,436,404 B2 | 5/2013 | Bohr et al. | |
| 8,536,656 B2 | 9/2013 | Ramachandran et al. | |
| 2005/0087801 A1 * | 4/2005 | Lindert | H01L 29/66636 257/330 |
| 2006/0192232 A1 * | 8/2006 | Ando | H01L 29/41775 257/288 |

(Continued)

*Primary Examiner* — Bilkis Jahan
*Assistant Examiner* — Kevin Quinto
(74) *Attorney, Agent, or Firm* — Fleit Gibbons Gutman Bongini & Bianco PL; Thomas Grzesik

(57) ABSTRACT

Self-aligned contacts of a semiconductor device are fabricated by forming a metal gate structure on a portion of a semiconductor layer of a substrate. The metal gate structure contacts inner sidewalls of a gate spacer. A second sacrificial epitaxial layer is formed on a first sacrificial epitaxial layer. The first sacrificial epitaxial layer is adjacent to the gate spacer and is formed on source/drain regions of the semiconductor layer. The first and second sacrificial epitaxial layers are recessed. The recessing exposes at least a portion of the source/drain regions. A first dielectric layer is formed on the exposed portions of the source/drain regions, and over the gate spacer and metal gate structure. At least one cavity within the first dielectric layer is formed above at least one of the exposed portions of source/drain regions. At least one metal contact is formed within the at least one cavity.

19 Claims, 11 Drawing Sheets

(56) References Cited

U.S. PATENT DOCUMENTS

| | | |
|---|---|---|
| 2007/0077709 A1 | 4/2007 | Kim |
| 2010/0264550 A1 | 10/2010 | Yang |
| 2011/0068396 A1* | 3/2011 | Cheng et al. ............. 257/335 |
| 2011/0298017 A1 | 12/2011 | Jain et al. |
| 2011/0298061 A1 | 12/2011 | Siddiqui et al. |
| 2012/0261829 A1 | 10/2012 | Lin et al. |
| 2013/0178033 A1 | 7/2013 | Bohr et al. |
| 2013/0187203 A1 | 7/2013 | Xie et al. |
| 2013/0234253 A1 | 9/2013 | Toh et al. |

* cited by examiner

US 9,324,830 B2

1

SELF-ALIGNED CONTACT PROCESS ENABLED BY LOW TEMPERATURE

The present disclosure generally relates to the field of semiconductors, and more particularly relates to self-aligned contacts for semiconductor devices.

BACKGROUND OF THE INVENTION

As transistor structures continue to be scaled down, the pitch scaling (i.e., the space between the gate and contact) becomes more and more challenging. As the two contact nodes become closer to each other, the yield of the transistor is the first to be affected since the gate to contact short results in extra leakage current or even device malfunction.

SUMMARY OF THE INVENTION

In one embodiment, a method for forming self-aligned contacts of a semiconductor device is disclosed. The method comprises forming a metal gate structure on a portion of a semiconductor layer of a substrate. The metal gate structure contacts inner sidewalls of a gate spacer. A second sacrificial epitaxial layer is formed on a first sacrificial epitaxial layer. The first sacrificial epitaxial layer is adjacent to the gate spacer and is formed on source/drain regions of the semiconductor layer. The first and second sacrificial epitaxial layers are recessed. The recessing exposes at least a portion of the source/drain regions. A first dielectric layer is formed on the exposed portions of the source/drain regions, and over the gate spacer and metal gate structure. At least one cavity within the first dielectric layer is formed above at least one of the exposed portions of source/drain regions. At least one metal contact is formed within the at least one cavity.

In another embodiment, a method for forming self-aligned contacts of a semiconductor device is disclosed. The method comprises forming a metal gate structure on a portion of the semiconductor layer of a substrate and contacting inner sidewalls of a gate spacer. A second epitaxial layer is formed on a first sacrificial epitaxial layer. The first epitaxial layer is adjacent to the gate spacer and is formed on source/drain regions of the semiconductor layer. A first dielectric layer is formed on a top surface of the second epitaxial layer. At least a portion of the first dielectric layer, the second epitaxial layer, and the first epitaxial layer is recessed. This recessing forms at one least cavity exposing at least a portion of at least one of the source/drain regions. At least one metal contact is formed within the at least one cavity.

In yet another embodiment, a semiconductor device is disclosed. The semiconductor device comprises a substrate and a semiconductor layer formed on the substrate. A metal gate structure is formed on a portion of the semiconductor layer. A gate spacer is formed on the metal gate structure. A first epitaxial layer is formed on source/drain regions of the semiconductor layer and adjacent to the gate spacer. A second epitaxial layer is formed on a top surface of the first epitaxial layer. At one self-aligned metal contact is formed on at least one of the source/drain regions.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

FIGS. 1 to 16 illustrate one or more processes for forming a semiconductor device with self-aligned contacts. It should be noted that although the following discussion is directed to a fin-field effect transistor (finFET), this discussion is also application to planar FETs. It should also be noted that one or more embodiments are not limited to the process for forming fin and gate structures discussed below. This discussion is provided for illustration purposes, and any process for fabricating the fin and gate structures of a finFET is applicable to embodiments of the present disclosure.

Embodiments of the present disclosure are advantageous over conventional self-aligned contact (SAC) fabrication processes and structures. In particular, one or more embodiments provide a robust SAC cap formation process without involving a gate recess. Gate recessing has been found to be a very uncontrollable process, and difficult to control the variation across the wafer. Instead of using a gate recessing process, one or more embodiments start with an epitaxial overfill to create a mode for the cap dielectric to deposit. This prevents the gate stack from being modified, which may cause transistor electrical parametric such as threshold voltage drift.

Figure 1:
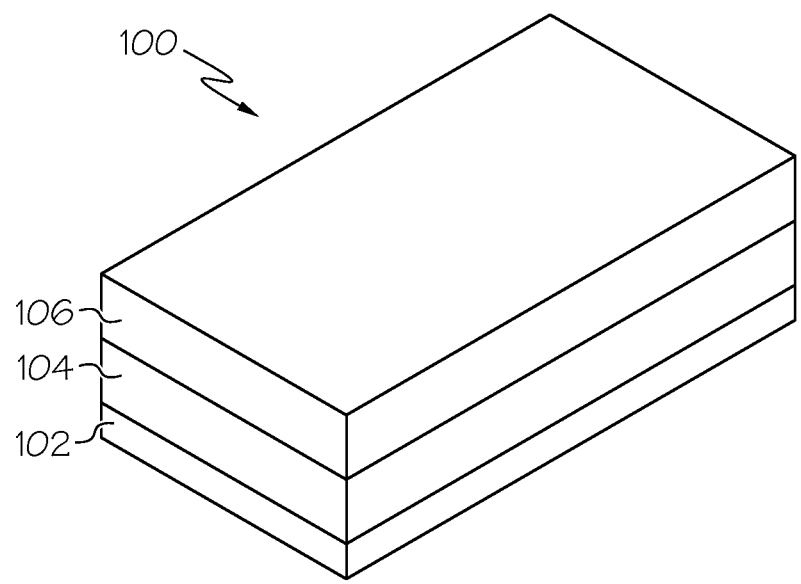
FIG. 1 is an isometric view of a semiconductor substrate according to one embodiment of the present disclosure.

FIG. 1 illustrates a cross-sectional view of a semiconductor structure 100 during a process of manufacturing thereof according to one embodiment of the present disclosure. The semiconductor structure 100 may be a part of a large semiconductor chip, for example, and is illustrated to include, among others, one or more three dimensional (3D) or fin-type field-effect-transistors (FETs) that are commonly known to include, for example, finFETs and tri-gate FETs. For the purpose of discussion hereinafter without losing generality, it is assumed and demonstratively illustrated that semiconductor structure 100 includes one or more finFETs (or finFET transistors), although the following discussion may be equally applied to tri-gate FETs with little or no modification.

In one embodiment, the semiconductor structure 100 comprises substrate 102 such as a silicon-on-insulator (SOI) substrate; a dielectric layer 104 (e.g., a BOX layer or oxide layer) overlying the substrate 102; and a semiconductor layer (SOI) layer 106 overlying the dielectric layer 104. The substrate layer 102 and the semiconductor layer 106 comprise at least one of Si, Ge alloys, SiGe, GaAs, InAs, InP, SiCGe, SiC, and other III/V or II/VI compound semiconductors. The substrate layer 102 and the semiconductor layer 106 can be made of the same or different materials. The dielectric layer 104, in one embodiment, is a crystalline or non-crystalline oxide, nitride, oxynitride, or any other insulating material. The semiconductor layer 106 can be formed utilizing a layer transfer process including a bonding step, or an implantation process such as SIMOX (Separation by IMplantation of OXygen).

The semiconductor layer 106 can be undoped or doped with either p-type or n-type dopants through ion implantation, plasma doping, or gas phase doping. P-type transistors are produced by doping the semiconductor layer 106 with elements from group III of the periodic table (e.g., boron, aluminum, gallium, or indium). As an example, the dopant can be boron in a concentration ranging from $1\times10E18$ atoms/cm3 to $2\times10E21$ atoms/cm3. N-type transistors are produced by doping the semiconductor layer 106 with elements from group V of the periodic table (e.g., phosphorus, antimony, or arsenic).

Figure 2:
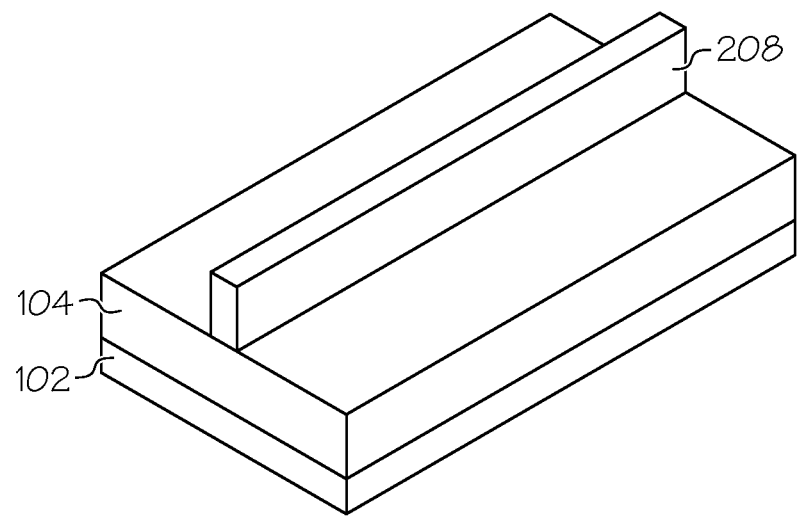
FIG. 2 is an isometric view illustrating a semiconductor fin structure having been formed on the semiconductor substrate according to one embodiment of the present disclosure.

The semiconductor layer 106 is formed into a one or more fin structures 208, as shown in FIG. 2. The fins 208 are formed, in one embodiment, by forming an etch-stop capping layer onto the semiconductor layer 106 through, for example, deposition. The etch-stop capping layer, in one embodiment, may be made of silicon-nitride although other material suitable in providing etch-stop function may be used as well. One or more fin structures 208 are subsequently formed or etched out of the semiconductor layer 106 to be on top of oxide layer 104 through a process involving masking, using industry-standard lithographic techniques, and directionally etching the etch-stop capping layer and underneath semiconductor layer 106.

The directional etching process, for example a reactive-ion-etching (RIE) process, stops on the dielectric layer 104. After the RIE etching process, the photo-resist mask used in the lithographic etching process may be removed, leaving patterns of fin structures 208 and caps (not shown), which is made of the etch-stop capping layer and is self-aligned to the find structures 208, on top of the semiconductor layer 106.

Figure 3:
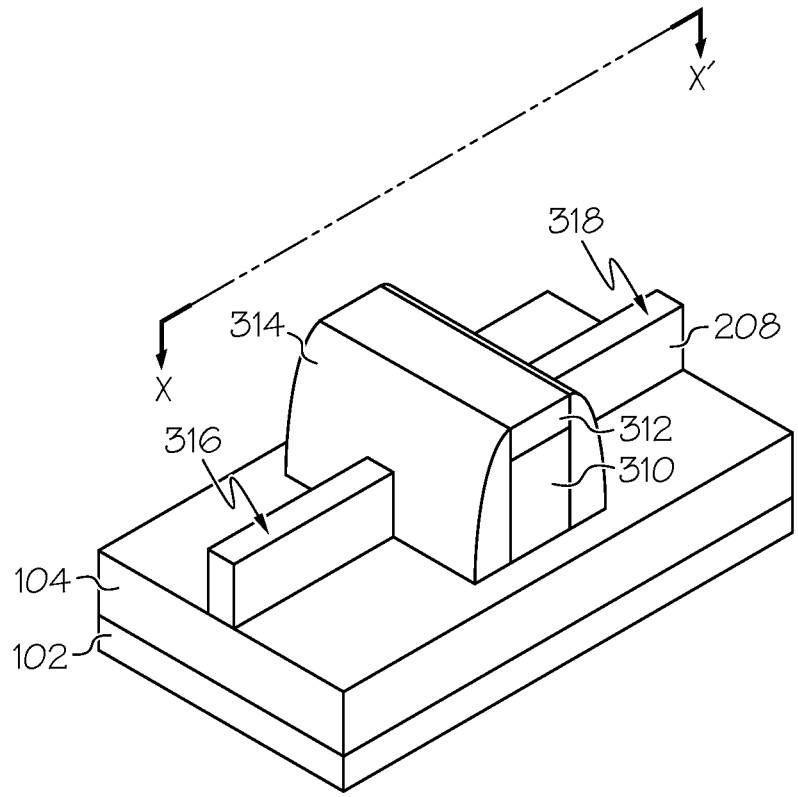
FIG. 3 is an isometric view illustrating a replacement gate structure having been formed on the semiconductor fin structure according to one embodiment of the present disclosure.

FIG. 3 shows that a replacement (dummy) gate 310 is formed on the fin structure(s) 208. The replacement gate 310 is formed, in one embodiment, using oxide, polysilicon, amorphous silicon, nitride, or a combination thereof. This replacement gate 310 acts as a placeholder for a subsequently formed gate stack. In this embodiment, an optional hard mask 312 is formed on top of the replacement gate 310. The hard mask 312 comprises a dielectric material such as a nitride, oxide, oxynitride material, and/or any other suitable dielectric layer. The dielectric hard mask 312 can be a single layer of dielectric material or multiple layers of dielectric materials, and can be formed by a deposition process such as chemical vapor deposition (CVD) and/or atomic layer deposition (ALD). Alternatively, the hard mask 312 can be grown, such as through thermal oxidation or thermal nitridation.

In the illustrated embodiment, a gate (dielectric) spacer 314 is formed by depositing a conformal layer of dielectric material (such as an oxide, nitride, or oxynitride) and then performing an anisotropic etch (such as a reactive ion etch). After the gate spacer 314 has been formed, diffusion/annealing is performed to drive dopants from the semiconductor layer 106 into the fin structure 208 to form source/drain regions 316, 318. In an embodiment in which the semiconductor layer 106 is undoped, source/drain and extension implantation is performed using the gate spacer 314 to align the implantation for forming the source/drain regions 316, 318. In this embodiment, photolithography is used to selectively define NFET and PFET areas for deep source/drain and extension implants, and then ions are implanted. N-type species are implanted for NFETs, while p-type species are implanted for PFETs. A thermal anneal is then performed to activate and diffuse the ions, such as through a spike rapid-thermal anneal (RTA). It should be noted that, in other embodiments, the source/drain regions are raised source/drains formed using an epitaxial growth process.

Figure 4:
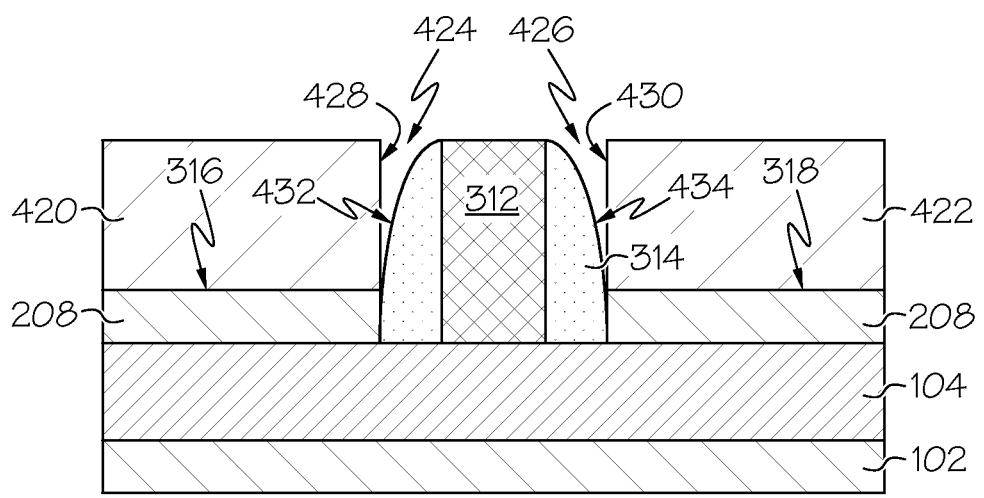
FIG. 4 is a cross-sectional view taken along the lines x-x' of FIG. 3, illustrating a first epitaxial layer having been formed adjacent to a gate spacer surrounding the replacement gate structure according to one embodiment of the present disclosure.
Figure 5:
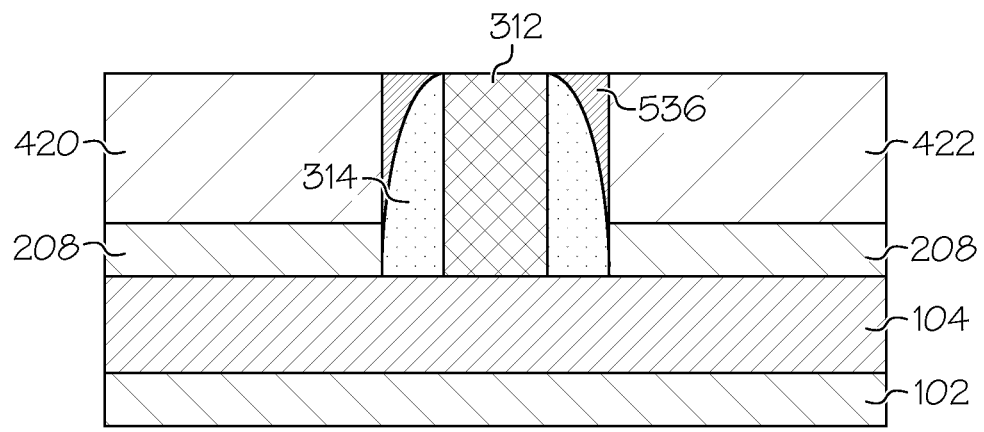
FIG. 5 is a cross-sectional view illustrating a first dielectric/oxide layer having been formed between the first epitaxial layer and the gate spacer according to one embodiment of the present disclosure.

A first epitaxial layer 420, 422 is formed on exposed surfaces of the source and drain regions 316, 318, as shown in FIG. 4. In the illustrated example, each portion of the first epitaxial layer 420, 422 is located on a respective side of the gate spacer 314. In this embodiment, the first epitaxial layer 420, 422 is formed through a high-temperature epitaxial growth process. For example, the high-temperature epitaxial growth process starts with a wet pre-clean, which includes diluted hydro-fluoric acid to remove native oxide and a pre-bake at 700-750 degrees Celsius. The epitaxial process is performed at a high vacuum with Disilane and Germane gases, which were injected at around 600 degrees Celsius, with epitxial growth being sequentially performed within the temperature range of approximately 500 to 670 degrees Celsius. It should be noted that other temperature ranges are applicable as well.

By controlling the chemical reactants and the system parameters of the high-temperature epitaxial growth process, the deposited atoms arrive at the surface of the semiconductor layer 106 with sufficient energy to move around on the surface and orient themselves to the crystal arrangement of the atoms of the deposition surface. Thus, an epitaxial film deposited on a [100] crystal surface will take on a [100] orientation. If, on the other hand, the wafer has an amorphous surface layer, the deposited atoms have no surface to align to and form polysilicon instead of single crystal silicon. Silicon sources for the epitaxial growth include silicon tetrachloride, dichlorosilane (SiH2Cl2), and silane (SiH4). The temperature for this epitaxial silicon deposition is from approximately 500 to 670 degrees Celsius.

Further, in the illustrated embodiment, the high-temperature epitaxial growth process is formed through selective-epitaxial growth of SiGe atop the source/drain regions 420, 422 in the semiconductor layer 106. The Ge content of the epitaxial grown SiGe ranges from 5% to 60% (by atomic weight). In another embodiment, the Ge content of the epitaxially grown SiGe ranges from 10% to 40%. In one embodiment, the epitaxial growth layers 420, 422 comprise a height that is at least equal to the height of the replacement gate stack structure 312 and/or the gate spacer 314.

In some embodiment, after the first epitaxial layer 420, 422 is formed, a cavity 424, 426 exists between an inner sidewall 428, 430 of the first epitaxial layer 420, 422 and an outer wall 432, 434 of the gate spacer 314. A dielectric layer 536 is formed within the cavities 424, 426. In this embodiment, the dielectric layer 536 is a dielectric material such as silicon oxide, silicon nitride, silicon oxynitride, or a combination thereof that is formed through chemical vapor deposition (CVD). Excess dielectric material is then removed such as through CMP such the dielectric material 536 only remains within the cavities. In this embodiment, the top surface of the first epitaxial layer 420, 422, the top surface of the dielectric layer 536, the top surface of the replacement gate stack structure 312, and the top surface of the gate spacer 314 are co-planar.

Figure 6:
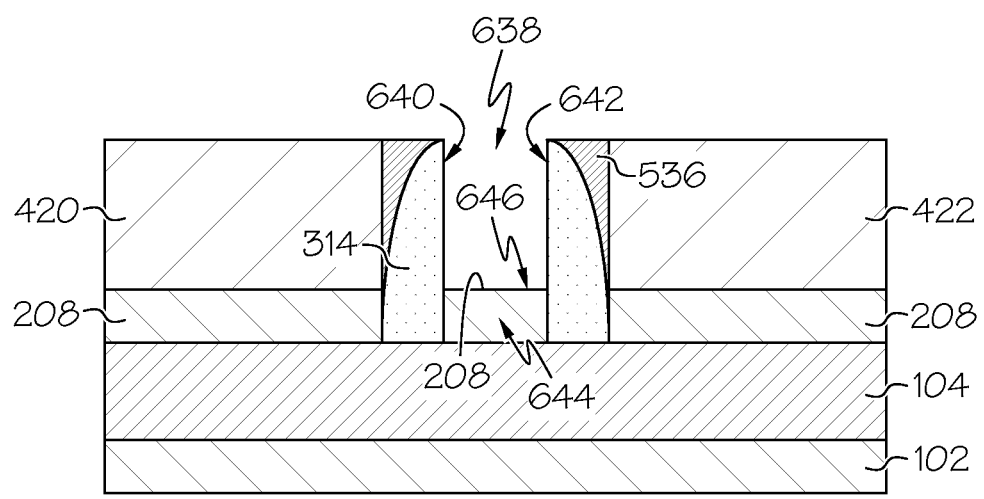
FIG. 6 is a cross-sectional view illustrating the replacement gate structure having been removed according to one embodiment of the present disclosure.
Figure 7:
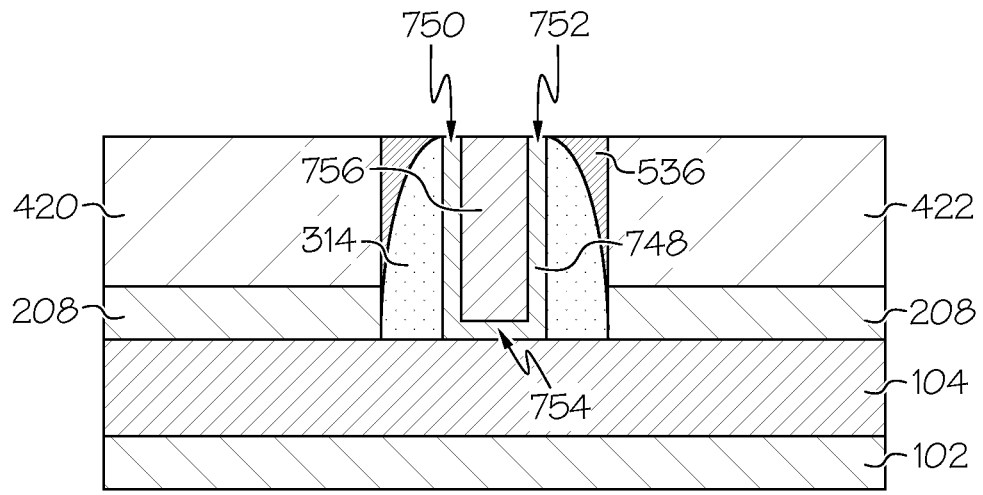
FIG. 7 is a cross-sectional view illustrating a metal gate structure having been formed on the semiconductor fin structure according to one embodiment of the present disclosure.

As shown in FIG. 6, the replacement gate stack structure 312 is selectively removed with respect to the gate spacer 316 and fin structure 208 (e.g., via selective etching). This forms a gate cavity 638 exposing at least portion of the inner sidewalls 640, 642 of the gate spacer 314, sidewalls 644 of the fin structure 208, and a top surface 646 of the fin structure 208. A high-k dielectric layer is then blanket deposited (for example, by CVD, PECVD, or ALD) and selectively etched using a process such as RIE to form a high-k dielectric spacer 748 on the portions of the gate spacer 314, fin and structure 208 exposed by the gate cavity 638, as shown in FIG. 7.

For example, the high-k dielectric spacer 748 is formed on the exposed inner sidewalls 640, 642 of the gate spacer 314, the sidewalls 644 of the fin structure 208, and the top surface 646 of the fin structure 208. The high-k dielectric spacer 748 comprises a first vertical portion 750, a second vertical portion 752, and a horizontal portion 754 in contact with both the first and second vertical portions 750, 752 and a top surface of the dielectric layer 104. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum.

After the high-k dielectric spacer 748 has been formed, a gate conductor material is then deposited over the structure, lithographically patterned, and etched to form a gate conductor 756 between the vertical sidewalls of the 750, 752 of the high-k dielectric spacer 748. The gate conductor material comprises a conductive material, which can be a doped semiconductor material, a metallic material, or a combination thereof. The doped semiconductor material can be doped polysilicon, doped polycrystalline germanium, a doped silicon-germanium alloy, any other doped elemental, a compound semiconductor material, or a combination thereof. The metallic material can be any metallic material that can be deposited by chemical vapor deposition (CVD), physical vapor deposition (PVD), or a combination thereof, such as aluminum, tungsten, ruthenium, or a conductive refractory metal nitride, such as TaN (tantalum nitride), TiN (titanium nitride), WN (tungsten nitride), TiAl (titanium aluminum), TiAlN (titanium aluminum nitride), TaCN (triazacyclononane), or an alloy thereof. In the illustrated embodiment, the gate conductor material can be aluminum, tungsten, ruthenium, or any conductive metal or metal alloy (such as aluminum-cobalt). The conductive material may further comprise dopants that are incorporated during or after deposition. The conductive material may comprises multiple layers such as gate work function setting layer and gate conductive layer.

Excess portions of the high-k gate dielectric layer 748 and gate conductor material 756 are removed by planarization, which can be performed by chemical mechanical planarization (CMP), recess etch, or a combination thereof. The remaining portion of the high-k gate dielectric layer 748 constitutes a U-shaped gate dielectric and the remaining portion of the gate conductive material layer 756 constitutes a gate conductor. The top surface of the U-shaped gate dielectric 748 and the top surface of the gate conductor 756 are coplanar with the top surface of the first epitaxial layer 420, 422 the top surface of the dielectric/oxide layer 536, and the top surface of the gate spacer 314, as shown in FIG. 7. The U-shaped gate dielectric 748 and the gate conductor 756 collectively constitute the gate stack of the transistor, where the gate spacer 314 laterally surrounds the gate stack.

Figure 8:
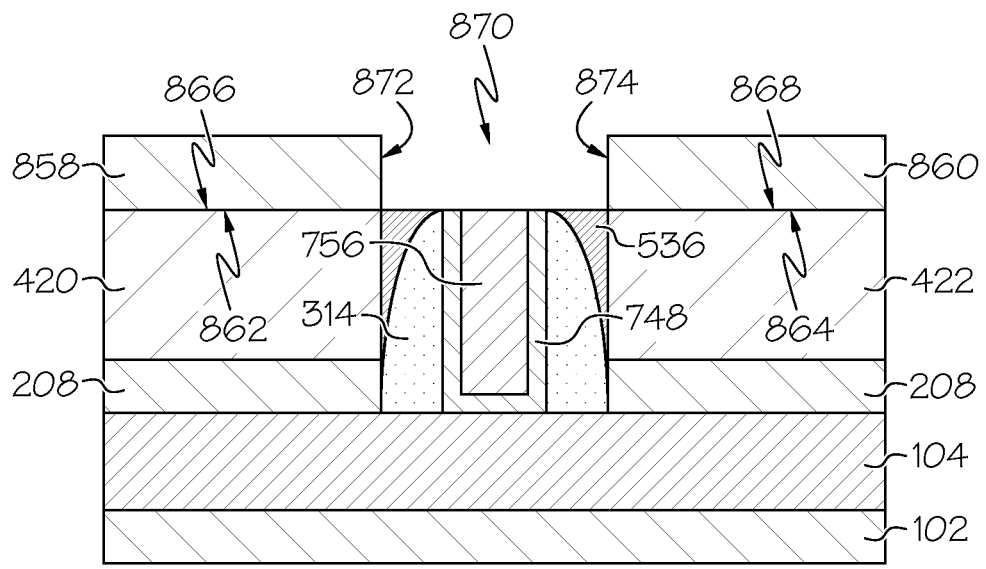
FIG. 8 is a cross-sectional view illustrating a second epitaxial layer having been formed on the first epitaxial layer according to one embodiment of the present disclosure.

After the metal gate has been formed, a second epitaxial layer 858, 860 is formed on the first epitaxial layer 420, 422 using a low-temperature epitaxial growth process, as shown in FIG. 8. For example, the low-temperature epitaxial growth process starts with hydrogen flowing as a plasma gas. Then, silane is introduced with the dilution ratio of H2/SiH4 of 2:1 to 3:1. The deposition pressures are in the mT regime, and the temperatures are between 300 and 400 degrees Celsius. However, other pressures and temperatures are applicable as well. In this embodiment, a bottom surface 862, 864 of the second epitaxial layer 858, 860 contacts a top surface 866, 868 of the first epitaxial layer 420 422 such that at least a portion of the second epitaxial layer 858, 860 is formed above the gate spacer 314 and/or gate stack 748, 754. In one embodiment, a width of the second epitaxial layer 858, 860 corresponds to a width of the underlying first epitaxial layer 420, 422. In this embodiment, a cavity 870 is formed between inner sidewalls 872, 874 of the second epitaxial layer 858, 860 exposing the top surface of the dielectric layer 536, the top surface of the gate spacer 314, the top surface of the U-shaped gate dielectric 748, and the top surface of the gate conductor 754.

Figure 9:
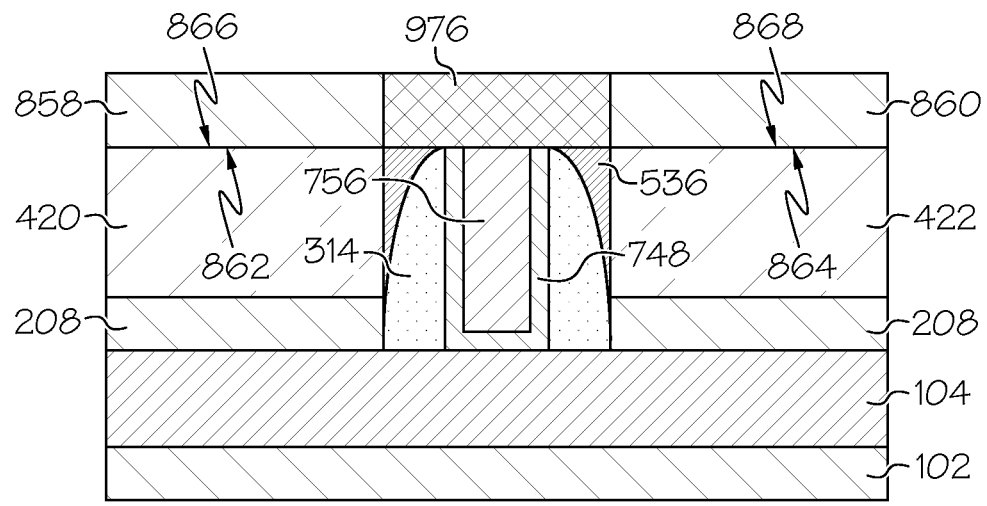
FIG. 9 is a cross-sectional view illustrating a second dielectric layer having been formed between inner sidewalls of the second epitaxial layer according to one embodiment of the present disclosure.
Figure 10:
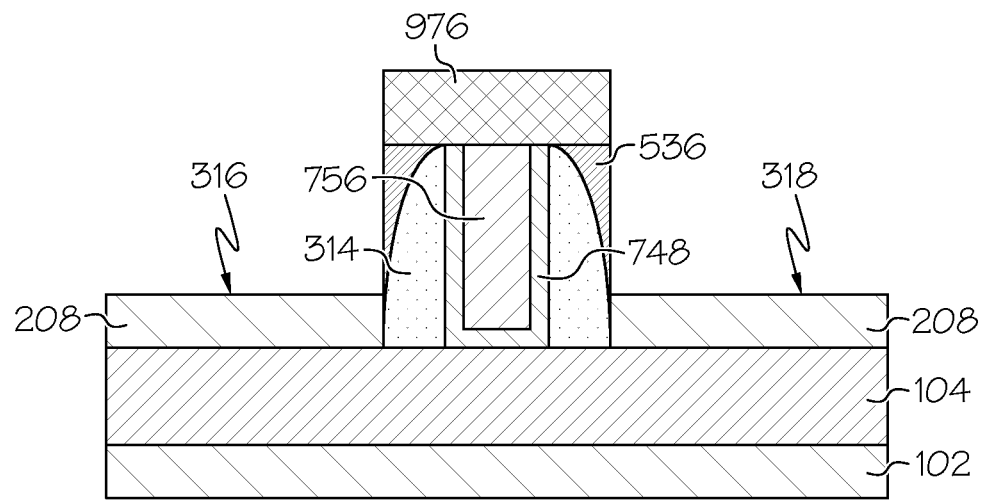
FIG. 10 is a cross-sectional view illustrating the first and second epitaxial layer having been recessed down to source/ and drain regions within the semiconductor fin structure according to one embodiment of the present disclosure.

After the second epitaxial layer 858, 860 has been formed, a second dielectric layer 976 is then formed within the cavity 870 between the inner sidewalls 872, 874 of the second epitaxial layer 858, 860, as shown in FIG. 9. Vertical sidewalls of the second dielectric layer 976 contact the inner sidewalls 872, 874 of the second epitaxial layer 860, 862. A bottom surface of the second dielectric layer 976 contacts a top surface of the dielectric layer 536, the top surface of the gate spacer 314, the top surface of the U-shaped gate dielectric 748, and the top surface of the gate conductor 754. In this embodiment, the top surface of the second dielectric layer 976 is co-planar with the top surface of the second epitaxial layer 858, 860. The second dielectric layer 976, in one embodiment, comprises an oxide material, nitride material, low-k material or any suitable combination of those materials FIG. 10 shows that once the second dielectric layer 976 has been formed, the first epitaxial layer 420, 422 and the second epitaxial layer 858, 860 are recessed/etched exposing at least a portion of the source and drain regions 316, 318 in the fin structure 208. Therefore, the first and second epitaxial layers 420, 422, 858, 860 are sacrificial in this embodiment. In one embodiment, the recessing/etching is performed using a wet etch process that is selective to the material of the SAC cap 976 and spacer 314. This recessing process exposes the vertical sidewalls of the first dielectric layer 536 formed on the walls of the gate spacer 314, and also exposes vertical sidewalls of the second dielectric layer 976. In an embodiment, where the first epitaxial layers 420, 422 contacts the gate spacer 314 and the dielectric/oxide layer 536 is not formed, the recessing of the first and second epitaxial layers 420, 422, 858, 860 exposes the outer sidewall of the gate spacer 314.

Figure 11:
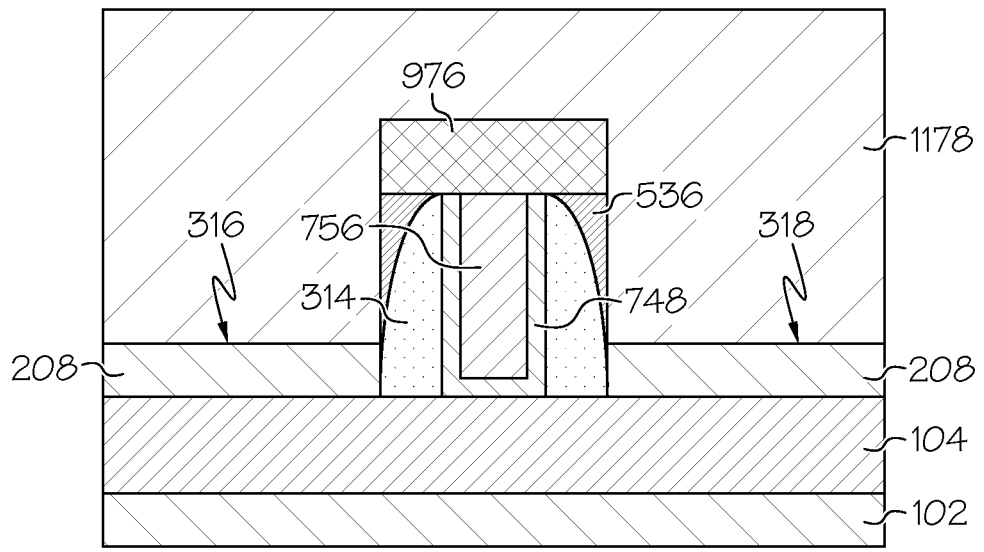
FIG. 11 is a cross-sectional view illustrating a third dielectric layer having been formed over the structure shown in FIG. 10 according to one embodiment of the present disclosure.

A third dielectric layer 1178 is then formed over the entire structure as shown in FIG. 11. In this embodiment, the third dielectric layer 1178 is formed on the exposed portions of the source and drain regions 316, 318, the vertical sidewalls of the first dielectric layer 536, the vertical sidewalls of the second dielectric layer 976, and a top surface of the second dielectric layer 976. In one embodiment, the third dielectric layer 1178 extends above the second dielectric layer 976. The third dielectric layer 1178, in one embodiment, is a dielectric material such as silicon oxide, silicon nitride, silicon oxynitride, or a combination thereof that is formed through chemical vapor deposition (CVD).

Figure 12:
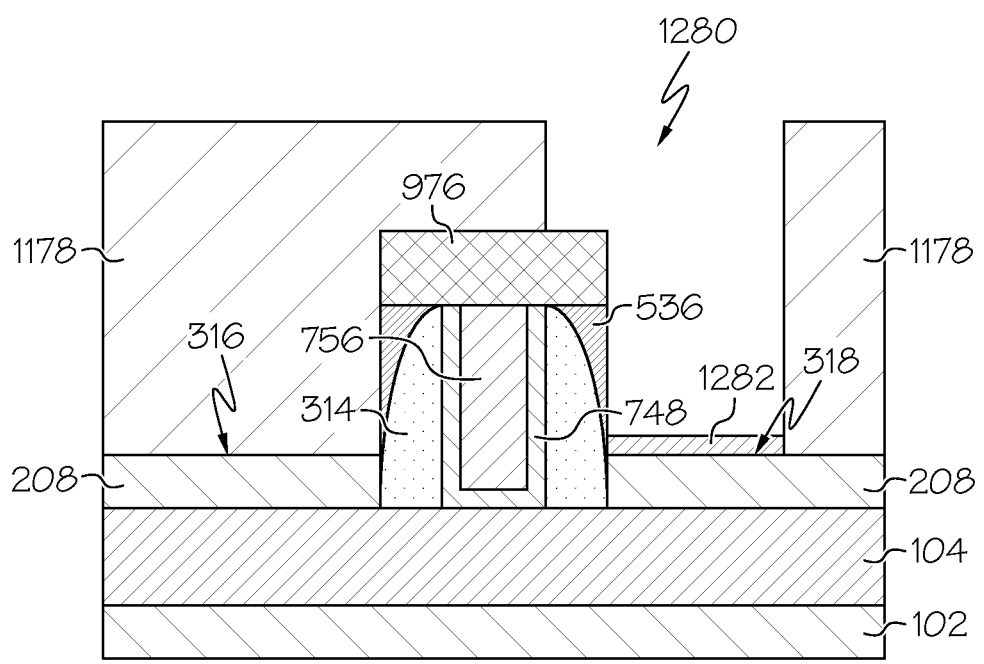
FIG. 12 is a cross-sectional view illustrating the third dielectric layer having been recessed forming a contact trench according to one embodiment of the present disclosure.

Next, portions of the third dielectric layer 1178 over at least one of the source and drain regions 316, 318 are removed (e.g., through a dry etch such as RIE and/or a wet etch using HF) so as to create at least one contact trench/opening 1280, as shown in FIG. 12. The contact trench(es) 1280 exposes a top surface of the source and/or drain regions 316, 318 formed within the fin structure 208; at least one vertical sidewall of the first dielectric layer 536; at least one vertical sidewall of the second dielectric layer 976; at least a portion of the top surface of the second dielectric layer 978; and vertical sidewalls of the third dielectrics layer 1178, where at least one of the vertical sidewalls is above and in contract with the top surface of the exposed portion of the second dielectric layer 976.

Figure 13:
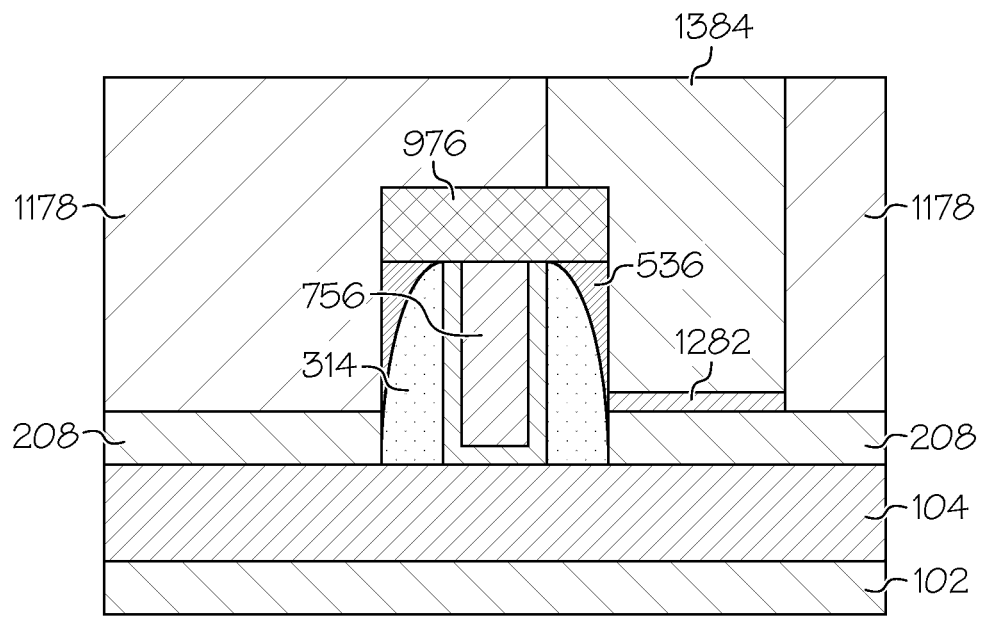
FIG. 13 is a cross-sectional view illustrating a metal contact having been formed within the contact trench according to one embodiment of the present disclosure.

An optional silicide region 1282 is formed within the contact trench(s) 1280 on at least a portion of the source and/or drain regions 316, 318, as shown in FIG. 12. In this embodiment, a metal is deposited on top of the source and/or drain regions 316, 318. An anneal is then performed to form silicide, and then the metal is selectively removed. The metal can comprise, for example, nickel, cobalt, titanium, platinum, or an alloy or combination thereof. After the silicide region(s) 1280 has been formed a contact(s), one or more self-aligned contacts 1384 is formed in the contact trench(es) 1280, as shown in FIG. 13. For example, the contact trench 1280 is filled with contact materials such as tungsten or copper, and polished to remove any excess above third dielectric layer 1178. The contact(s) 1384, in one embodiment, contacts the sidewalls of the contact trench 1280, which is comprised of a vertical sidewall(s) of the third dielectric layer 1178; the at least one vertical sidewall of the first dielectric layer 536; and the at least one vertical sidewall of the second dielectric layer 976. Also, the contact(s) 1384 extends over and contacts the portion(s) of the top surface of the second dielectric layer 976. The contact(s) 1280 further contacts the at least one vertical sidewall of the third dielectric layer 1178.

Figure 14:
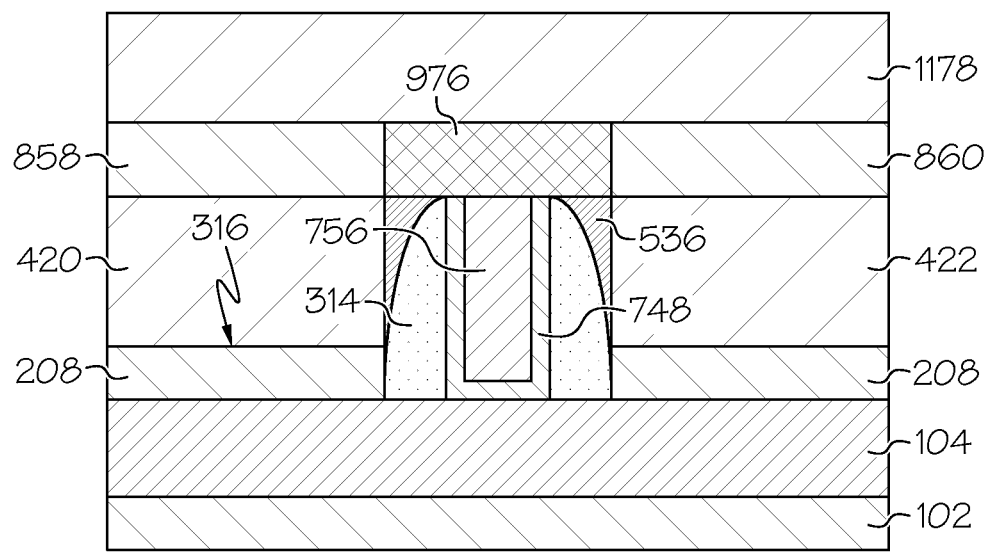
FIG. 14 is a cross-sectional view of the structure in FIG. 9 after the third dielectric layer has been formed over the second epitaxial layer and the second dielectric layer according to one embodiment of the present disclosure.
Figure 15:
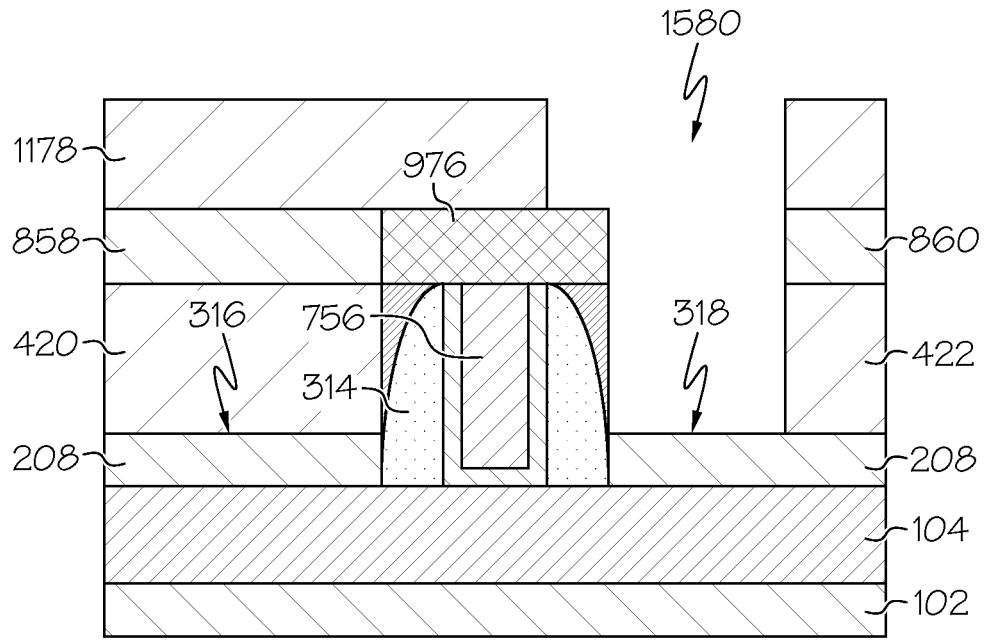
FIG. 15 is a cross-sectional view illustrating the third dielectric layer, the first dielectric layer, and the second dielectric layer of FIG. 14 having been recessed forming a contact trench according to one embodiment of the present disclosure.

It should be noted that in some embodiments, the first epitaxial layers 420, 422 and the second epitaxial layers 858, 860 are not removed/recessed after the first dielectric layer 536 is formed. In this embodiment, the third dielectric layer 1178 is formed on top of and in contact with the second epitaxial layers 858, 860 and the second dielectric layer 976, as shown in FIG. 14. A first etching/recessing process etches at least a first portion of the third dielectric layer 1178 to expose at least a portion of the second dielectric layer 976 and at least a portion second epitaxial layer 858, 860. A second etching/recessing process etches the exposed portion of the second epitaxial layer 858, 860 and at least a portion of the first epitaxial layer 420, 422 under the exposed portion of the second epitaxial layer 858, 860, as shown in FIG. 15. These etching/recessing processes creates at least one contact trench 1580 that exposes at least a portion of the source and/or drain regions 316; at least one vertical sidewall of the first dielectric layer 536; at least one vertical sidewall of the second dielectric layer 976; at least a portion of the top surface of the second dielectric layer 978; at least one vertical sidewall of the third dielectric layer 1178; and vertical sidewalls of the third dielectrics layer, where at least one of the vertical sidewalls is above and in contract with the top surface of the exposed portion of the second dielectric layer 976.

Figure 16:
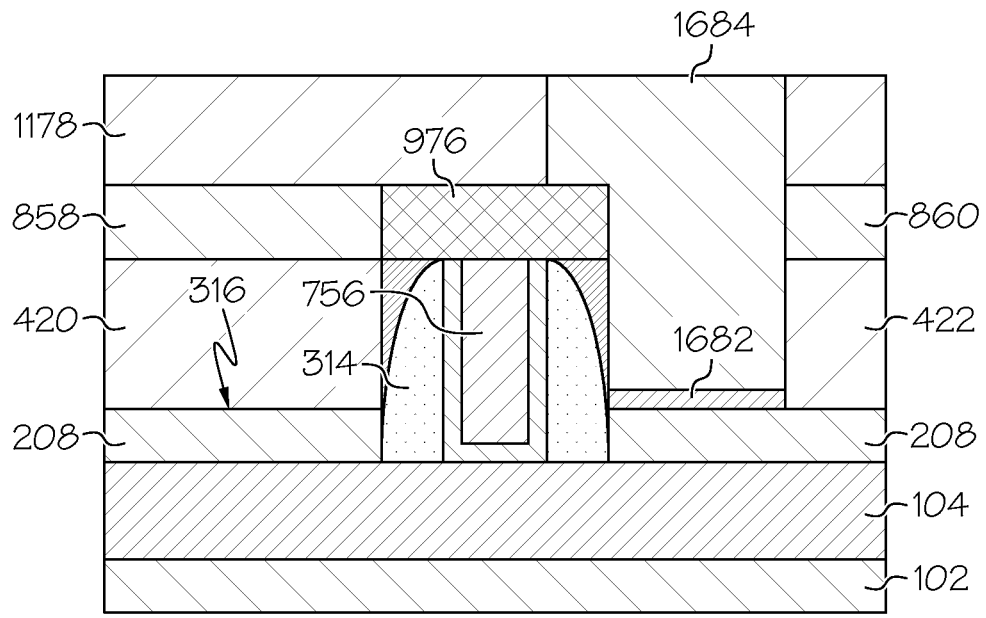
FIG. 16 is a cross-sectional view illustrating a metal contact having been formed in the contact trench of FIG. 15 according to one embodiment of the present disclosure.

FIG. 16 shows that an optional silicide region 1682 is formed within the contact trench 1580 on at least a portion of the exposed source and/or drain regions 316, 318, as discussed above with respect to FIG. 12. FIG. 16 shows that a contact(s) 1684 is then formed in the contact trench 1580, as discussed above with respect to FIG. 12. In this embodiment, the contact(s) 1684, is formed on the sidewalls of the contact trench 1580 comprised of the at least one vertical sidewall of the first dielectric layer 536; the at least one vertical sidewall of the second dielectric layer 976; the vertical sidewall(s) of the first epitaxial layer 420, 422; and the vertical sidewall(s) of the second epitaxial layer 858, 860. Also, the contact(s) 1684 extends over and contacts the portion(s) of the top surface of the second dielectric layer 976, and further contacts the vertical sidewalls of the third dielectric layer 976.

Figure 17:
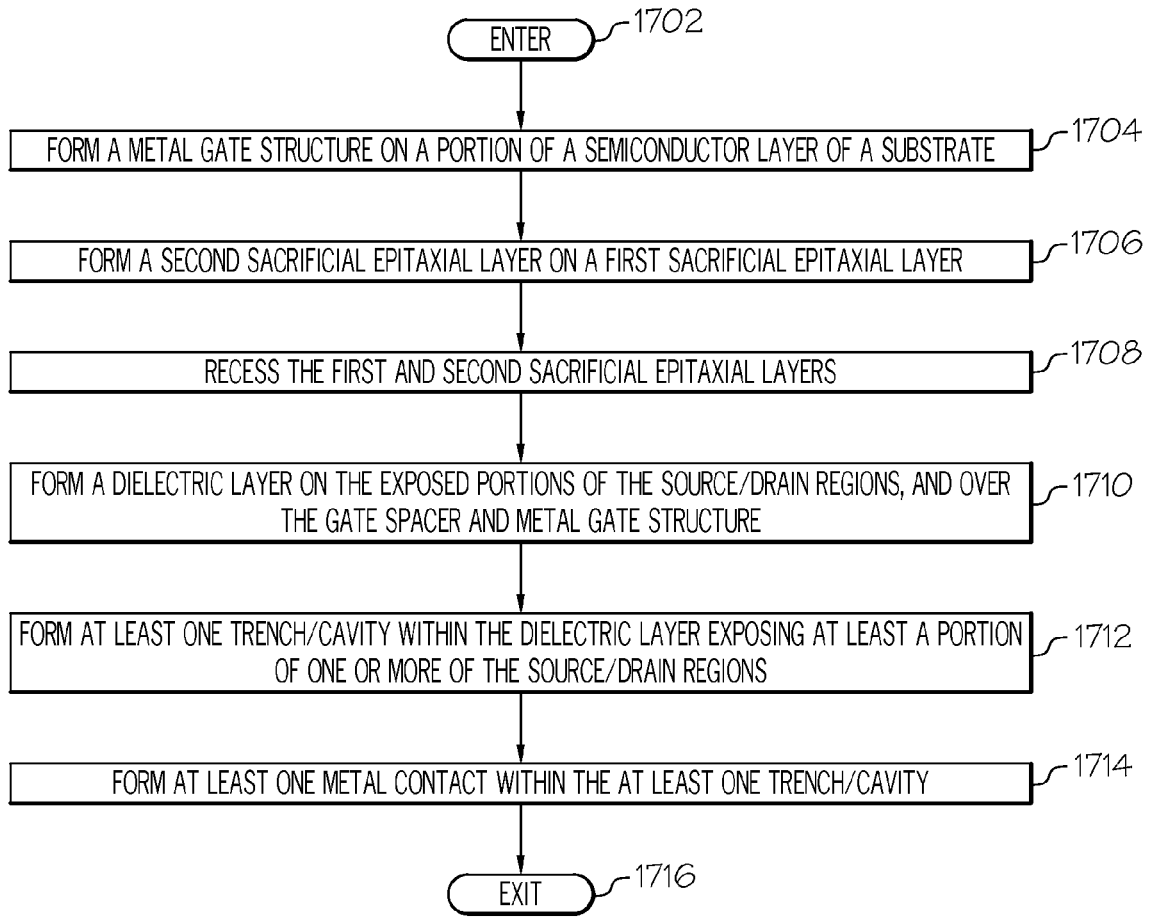
FIG. 17 is an operational flow diagram illustrating one process for one forming self-aligned contacts of a semiconductor device according to one embodiment of the present disclosure.

FIG. 17 is an operational flow diagram illustrating one process for forming self-aligned contacts of a semiconductor device. In FIG. 17, the operational flow diagram begins at step 1702 and flows directly to step 1704. A metal gate structure 748, 756, at step 1704, is formed on a portion of a semiconductor layer 106/208 of a substrate 102. The metal gate structure 748, 756 contacts inner sidewalls of a gate spacer 314. A second sacrificial epitaxial layer 858, 860, at step 1706, is formed a first sacrificial epitaxial layer 420, 422. The first sacrificial epitaxial layer 420, 422 is adjacent to the gate spacer 314 and is formed on source/drain regions 316, 318 of the semiconductor layer 106/208. The first and second sacrificial epitaxial layers 420, 422, 858, 860, at step 1708, are recessed. The recessing exposes at least a portion of the source/drain regions 316, 318. A dielectric layer 1178, at step 1710, is formed on the exposed portions of the source/drain regions 316, 318, and over the gate spacer 314 and metal gate structure 748, 756. At least one trench/cavity 1280, at step

1712, is formed within the dielectric layer 1178 exposing at least a portion of one or more of the source/drain regions 316, 318. At least one metal contact 1284, at step 1714, is formed within the at least one cavity 1280. The control flow exits at step 1716.

Figure 18:
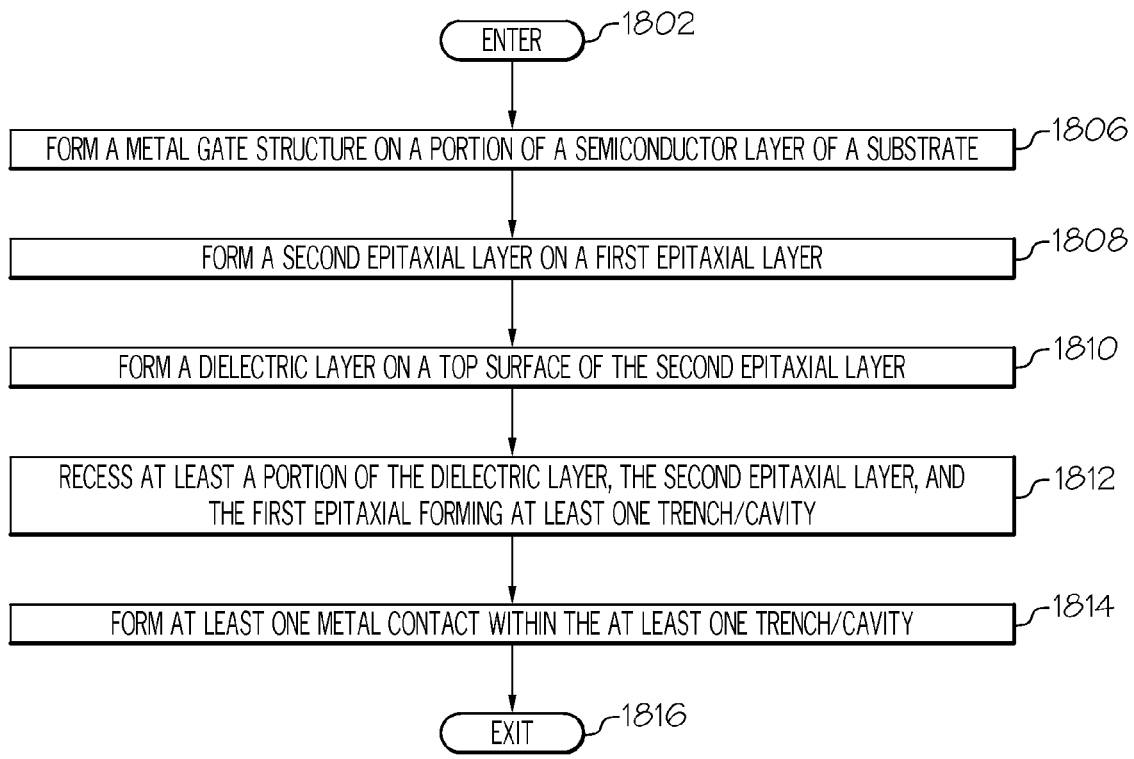
FIG. 18 is an operational flow diagram illustrating another process for one forming self-aligned contacts of a semiconductor device according to one embodiment of the present disclosure.

FIG. 18 is an operational flow diagram illustrating another process for forming self-aligned contacts of a semiconductor device. In FIG. 18, the operational flow diagram begins at step 1802 and flows directly to step 1804. A metal gate structure 748, 756, at step 1804 is formed on a portion of the semiconductor layer 106/208 of a substrate 102 and contacts inner sidewalls of a gate spacer 314. A second epitaxial layer 858, 860, at step 1806, is formed a first epitaxial layer 420, 422. The first epitaxial layer 420, 422 is adjacent to the gate spacer 314 and is formed on source/drain regions 316, 318 of the semiconductor layer 106/208. A dielectric layer 1178, at step 1808, is formed on a top surface of the second epitaxial layer 858, 860. At least a portion of the dielectric layer 1178, the second epitaxial layer 858, 860, and the first epitaxial layer 420, 422, at step 1810 is recessed. The recessing forming at one least trench/cavity 1580 exposing at least a portion of at least one of the source/drain regions 316, 318. At least one metal contact 1684, at step 1812, is formed within the at least one cavity 1580.

Figure 19:
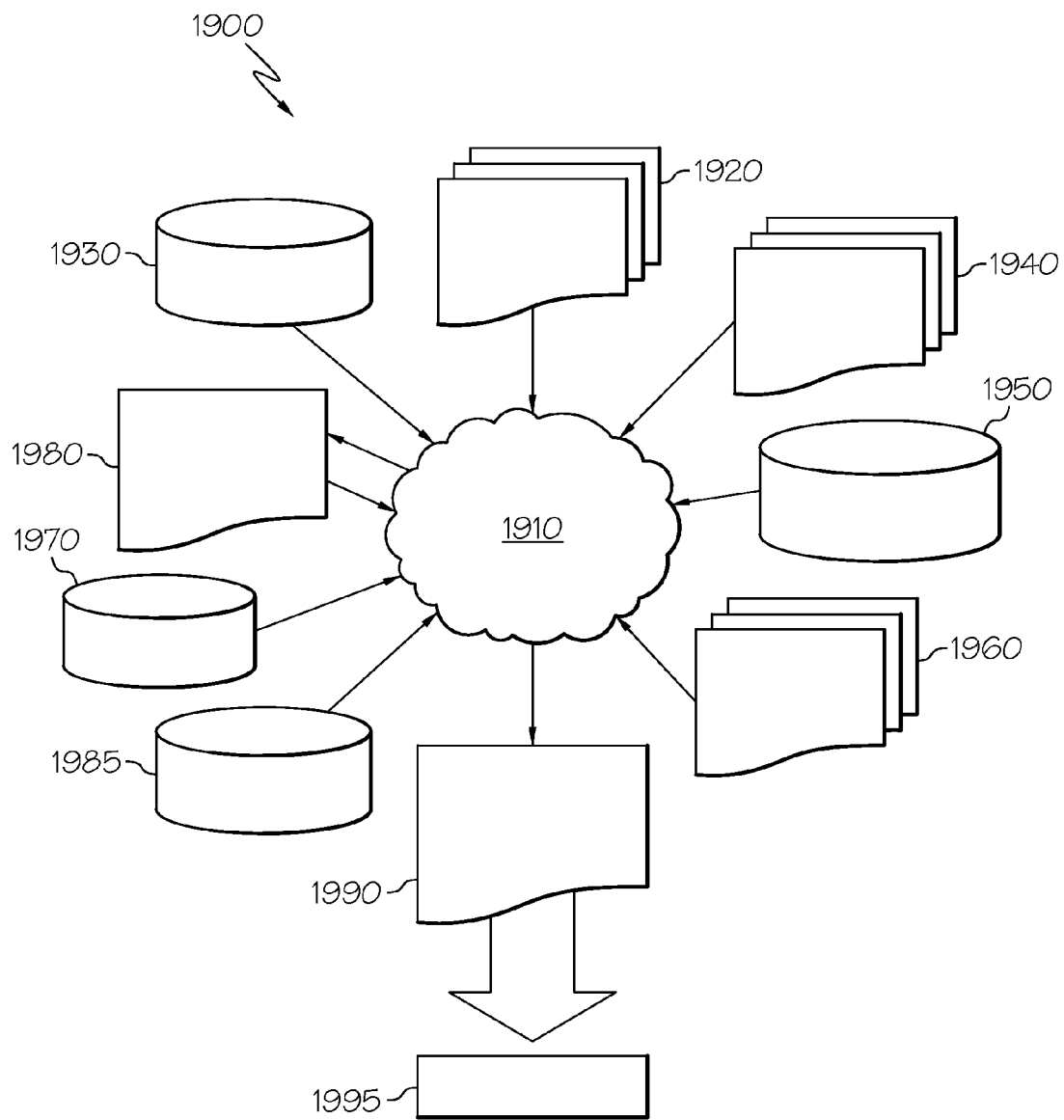
FIG. 19 is a flow diagram of a design process used in semiconductor design, manufacture, and/or test according to one embodiment of the present disclosure.

FIG. 19 shows a block diagram of an exemplary design flow 1900 used for example, in semiconductor IC logic design, simulation, test, layout, and manufacture. Design flow 1900 includes processes, machines, and/or mechanisms for processing design structures or devices to generate logically or otherwise functionally equivalent representations of the design structures and/or devices described above and shown in FIGS. 1-16. The design structures processed and/or generated by design flow 1900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1900 may vary depending on the type of representation being designed. For example, a design flow 1900 for building an application specific IC (ASIC) may differ from a design flow 1900 for designing a standard component or from a design flow 1900 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 1920 that is preferably processed by a design process 1910. Design structure 1920 may be a logical simulation design structure generated and processed by design process 1910 to produce a logically equivalent functional representation of a hardware device. Design structure 1920 may also or alternatively comprise data and/or program instructions that when processed by design process 1910, generate a functional representation of the physical structure of a hardware device. Whether representing functional and/or structural design features, design structure 1920 may be generated using electronic computer-aided design (ECAD) such as implemented by a core developer/designer. When encoded on a machine-readable data transmission, gate array, or storage medium, design structure 1920 may be accessed and processed by one or more hardware and/or software modules within design process 1910 to simulate or otherwise functionally represent an electronic component, circuit, electronic or logic module, apparatus, device, or system such as those shown in FIGS. 1-16. As such, design structure 1920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1910 preferably employs and incorporates hardware and/or software modules for synthesizing, translating, or otherwise processing a design/simulation functional equivalent of the components, circuits, devices, or logic structures shown in FIGS. 1-16 to generate a Netlist 1980 which may contain design structures such as design structure 1920. Netlist 1980 may comprise, for example, compiled or otherwise processed data structures representing a list of wires, discrete components, logic gates, control circuits, I/O devices, models, etc. that describes the connections to other elements and circuits in an integrated circuit design. Netlist 1980 may be synthesized using an iterative process in which netlist 1980 is resynthesized one or more times depending on design specifications and parameters for the device. As with other design structure types described herein, netlist 1980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1910 may include hardware and software modules for processing a variety of input data structure types including Netlist 1980. Such data structure types may reside, for example, within library elements 1930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1940, characterization data 1950, verification data 1960, design rules 1970, and test data files 1985 which may include input test patterns, output test results, and other testing information. Design process 1910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1910 without deviating from the scope and spirit of the invention. Design process 1910 may also include modules for performing standard circuit design processes such as timing analysis, verification, design rule checking, place and route operations, etc.

Design process 1910 employs and incorporates logic and physical design tools such as HDL compilers and simulation model build tools to process design structure 1920 together with some or all of the depicted supporting data structures along with any additional mechanical design or data (if applicable), to generate a second design structure 1990. Design structure 1990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1920, design structure 1990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-16. In one embodiment, design structure 1990 may comprise a compiled, executable HDL simulation model that functionally simulates the devices shown in FIGS. 1-16.

Design structure 1990 may also employ a data format used for the exchange of layout data of integrated circuits and/or symbolic data format (e.g. information stored in a GDSII (GDS2), GL1, OASIS, map files, or any other suitable format for storing such design data structures). Design structure 1990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-16. Design structure 1990 may then proceed to a stage 1995 where, for example, design structure 1990: proceeds to tape-out, is released to manufacturing, is released to a mask house, is sent to another design house, is sent back to the customer, etc.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming self-aligned contacts for a semiconductor device, the method comprising:
    forming a metal gate structure on a portion of a semiconductor layer of a substrate and contacting inner sidewalls of a gate spacer;
    forming a second sacrificial epitaxial layer on a first sacrificial epitaxial layer, wherein the first sacrificial epitaxial layer is adjacent to the gate spacer and is formed on source/drain regions of the semiconductor layer;
    recessing the first and second sacrificial epitaxial layers, the recessing exposing at least a portion of the source/drain regions;
    forming a first dielectric layer on the exposed portions of the source/drain regions, and over the gate spacer and metal gate structure;
    forming at least one cavity within the first dielectric layer above at least a portion of one or more of the source/drain regions; and
    forming at least one metal contact within the at least one cavity.

2. The method of claim 1, wherein prior to forming the metal gate structure the method comprises:
    forming a replacement gate structure on the portion of the semiconductor layer;
    forming the gate spacer on the replacement gate structure;
    forming the first sacrificial epitaxial layer on the source/drain regions, wherein forming the first sacrificial epitaxial layer creates a cavity between the first sacrificial epitaxial layer and an outer sidewall of the gate spacer; and
    forming a second dielectric layer within the cavity between the first sacrificial epitaxial layer and the outer sidewall of the gate spacer.

3. The method of claim 2, wherein forming the metal gate structure comprises:
    removing the replacement gate structure, the removing exposing the portion of the semiconductor layer; and
    forming a dielectric spacer on the exposed portion of the semiconductor layer; and
    forming a gate conductor within the cavity in contact with the dielectric spacer.

4. The method of claim 1, wherein the portion of the semiconductor layer comprises a fin structure.

5. The method of claim 1, further comprising:
    forming the first sacrificial epitaxial layer at a first temperature; and
    forming the second sacrificial epitaxial layer at a second temperature, wherein the first temperature is higher than the second temperature.

6. The method of claim 1, further comprising:
    forming a third dielectric layer between and in contact with a first inner sidewall of the second sacrificial epitaxial layer and a second inner sidewall of the second sacrificial epitaxial layer, wherein the third dielectric layer is further formed above and in contact with the metal gate structure.

7. The method of claim 6, wherein the at least one cavity exposes at least a portion of the third dielectric layer, and wherein the at least one metal contact is further formed on the portion of the third dielectric layer.

8. A method of forming self-aligned contacts for a semiconductor device, the method comprising:

forming a metal gate structure on a portion of the semiconductor layer of a substrate and contacting inner sidewalls of a gate spacer;

forming a second epitaxial layer on a first sacrificial epitaxial layer, wherein the first epitaxial layer is adjacent to the gate spacer and is formed on source/drain regions of the semiconductor layer;

forming a first dielectric layer on a top surface of the second epitaxial layer;

recessing at least a portion of the first dielectric layer, the second epitaxial layer, and the first epitaxial layer, the recessing forming at one least cavity exposing at least a portion of at least one of the source/drain regions; and forming at least one metal contact within the at least one cavity.

9. The method of claim 8, wherein prior to forming the metal gate structure the method comprises:

forming a replacement gate structure on the portion of the semiconductor layer;

forming the gate spacer on the replacement gate structure;

forming the first epitaxial layer on the source/drain regions, wherein forming the first epitaxial layer creates a cavity between the first epitaxial layer and an outer sidewall of the gate spacer; and forming a second dielectric layer within the cavity between the first epitaxial layer and the outer sidewall of the gate spacer.

10. The method of claim 9, wherein forming the metal gate structure comprises:

removing the replacement gate structure, the removing exposing the portion of the semiconductor layer; and forming a dielectric spacer on the exposed portion of the semiconductor layer; and forming a gate conductor within the cavity in contact with the dielectric spacer.

11. The method of claim 8, wherein the portion of the semiconductor layer comprises a fin structure.

12. The method of claim 8, further comprising:

forming the first epitaxial layer at a first temperature; and forming the second epitaxial layer at a second temperature, wherein the first temperature is higher than the second temperature.

13. The method of claim 8, further comprising:

prior to the first dielectric layer being formed, forming a second dielectric layer between and in contact with a first inner sidewall of the second epitaxial layer and a second inner sidewall of the second epitaxial layer, wherein the third dielectric layer is further formed above and in contact with the metal gate structure.

14. The method of claim 8, wherein the at least one cavity exposes at least a portion of the second dielectric layer, and wherein the at least one metal contact is further formed on the portion of the second dielectric layer.

15. A semiconductor device comprising:

a substrate;

a semiconductor layer formed on the substrate;

a metal gate structure formed on a portion of the semiconductor layer;

a gate spacer formed on the metal gate structure;

a first epitaxial layer formed on source/drain regions of the semiconductor layer and adjacent to the gate spacer;

a second epitaxial layer formed on a top surface of the first epitaxial layer, wherein at least a portion of the second epitaxial layer is formed above of the metal gate structure; and at least one self-aligned metal contact formed on at least one of the source/drain regions; and a dielectric layer formed between and in contact with a first inner sidewall of the second epitaxial layer and a second inner sidewall of the second epitaxial layer, wherein the dielectric layer is further formed above and in contact with the metal gate structure.

16. The semiconductor device of claim 15, wherein the at least one metal contact is in contact with at least a sidewall and a portion of a top surface of the dielectric layer.

17. The semiconductor device of claim 15, further comprising:

a dielectric layer formed between and in contact with an inner sidewall of the first epitaxial layer and an outer sidewall of the gate spacer.

18. The semiconductor device of claim 15, further comprising:

a dielectric layer formed on a top surface of the second epitaxial layer.

19. The semiconductor device of claim 18, wherein the at least one metal contact is in contact with at least a sidewall of the dielectric layer.

* * * * *